United States Patent

Rao

[11] Patent Number: 5,982,696
[45] Date of Patent: Nov. 9, 1999

[54] MEMORIES WITH PROGRAMMABLE ADDRESS DECODING AND SYSTEMS AND METHODS USING THE SAME

[75] Inventor: G. R. Mohan Rao, Dallas, Tex.

[73] Assignee: Cirrus Logic, Inc., Fremont, Calif.

[21] Appl. No.: 08/659,664

[22] Filed: Jun. 6, 1996

[51] Int. Cl.⁶ ...................................................... G11C 8/00
[52] U.S. Cl. ................................ 365/230.03; 365/230.06
[58] Field of Search ..................... 365/230.03, 230.06, 365/218, 185.11

[56] References Cited

U.S. PATENT DOCUMENTS

| | | | |
|---|---|---|---|
| 4,398,248 | 8/1983 | Hsia et al. | 365/230.03 |
| 4,908,795 | 3/1990 | Tsuchiya et al. | 365/185.11 |
| 5,036,493 | 7/1991 | Nielsen | 365/230.03 |
| 5,313,420 | 5/1994 | Masuoka | 365/218 |
| 5,416,746 | 5/1995 | Sato | 365/230.03 |
| 5,537,564 | 7/1996 | Hazanchuk et al. | 365/230.03 |
| 5,583,822 | 12/1996 | Rao | 365/230.03 |
| 5,652,723 | 7/1997 | Dosaka et al. | 365/230.03 |

*Primary Examiner*—David Nelms
*Assistant Examiner*—Trong Phan
*Attorney, Agent, or Firm*—James J. Murphy; Steven A. Shaw

[57] ABSTRACT

A memory 201 comprising an array 302 of memory cells, an address decoder 303, 305 for accessing a selected one of the cells in response to at least one address bit, and a programmable array 311 for selectively presenting the at least one address bit to the address decoder 303, 305 in response to a control signal.

28 Claims, 5 Drawing Sheets

MEMORIES WITH PROGRAMMABLE ADDRESS DECODING AND SYSTEMS AND METHODS USING THE SAME

TECHNICAL FIELD OF THE INVENTION

The present invention relates in general to electronic memories and in particular to memories with programmable address decoding and systems and methods using the same.

BACKGROUND OF THE INVENTION

The typical semiconductor memory includes an array of memory cells organized in intersecting rows and columns. The cells along each row in the array are coupled to a conductive wordline whose voltage is controlled by an associated row decoder. The cells of each column are coupled to at least one bitline, which is in turn coupled to and controlled by a sense amplifier and a column decoder. During an access, a row address is presented to the row decoder to activate (select) the cells of a corresponding row in the array. Data is then exchanged (read or written) with a location, comprising one or more cells along the selected row, through the corresponding sense amplifier(s) and the column decoder in response to a column address.

In the case of a dynamic random access memory (DRAMs), memory operations, including accesses, are timed by a master clock CLK, (synchronized), a row address strobe (/RAS) and a column address strobe (/CAS). Two periods, an active cycle and a precharge cycle, together constitute one random cycle. First, /RAS and /CAS allow for the word-serial input of row and column addresses from a multiplexed address bus. Second, /RAS times the active and precharge cycles. When /RAS is in a logic high state, the DRAM device is in a precharge, during which the nodes of various dynamic circuits, such as those used in the column and row decoders, are brought to a predetermined voltage. Most importantly, during the precharge cycle the bitlines of the cell array are voltage equalized. Then, with the falling edge of /RAS, the device enters the active state and the row address presented to the address pins is latched into the address latches. After a very small delay for set up, the column address is presented at the address pins and latched-in to the address latches with /CAS. A short time thereafter the addressed cells (location) can be accessed (i.e. a "random access" can be performed). During page mode accesses, additional column addresses are input with additional falling edges of /CAS (i.e. /CAS cycling) to access a series of locations or "pages" along the selected row. At the end of the active state, /RAS returns to a logic high state and the device re-enters precharge.

Similar accessing schemes are used in other types of volatile memories, such as static random access memories (SRAMs), as well as non-volatile memories, such as electrically-programmable read-only memories (EPROMs). The only significant differences between the access operations of these devices and the DRAM discussed above is in the actual circuit construction. For example, while DRAMs are normally constructed from dynamic circuitry and operate in the precharge and active states described above in order to save power, SRAMs are typically designed for speed and are therefore normally constructed from static circuitry and operate in a single active cycle.

In each type of conventional semiconductor memory however, the row and column decoders are hardwired such that a given row or column address always selects only one corresponding row or column in the array. Conversely, a given row or column in the array must always be selected using the same row or column address. Thus, because the address decoders are hardwired, an address selecting a given row/column of cells cannot be "moved" and used to address another row/column of cells. Only means by which data can be moved from one location to another is by changing the address as required to access that data at the new location.

The hardwired address decoders of presently available memory devices create substantial disadvantages in many memory applications, such as the construction and operation of the main memory subsystem of information processing systems. In particular, fixed address memories are inefficient when used in the system (main) memory of PC systems running the popular operating systems and applications software. In these systems, each of the memory devices normally has the identical address space which makes individual chip accessing difficult, in light of limitations on the CPU and software operations, when a small amount of main memory is repeatedly and continually required.

Most often, the operating system, in conjunction with the CPU and application software, generates addresses to access (read from or write to) memory as is most convenient to execute a given task. In view of the relative inexpensiveness of memory, efficient use of memory becomes a secondary consideration next to system operating performance. In fact, typically, execution of a given instruction always associates a given piece of data, such as an operand called for by that instruction, with a particular address to memory. Thus, during the execution of the instructions required for a given task, the operating system and CPU may generate addresses which, because of the fixed nature of the address decoding within the memory devices of the system memory, results in data being accessed to locations distributed across multiple chips. This distribution of data throughout the system memory takes place, even though the type of task being performed and/or the type of data being operated on suggests that the required accesses would be more efficient if made to fewer chips, if not a single chip. Further, even when the addresses are to the same chip, the majority of the time the resulting accesses are not to the same page, and as a result multiple random accesses are still required rather than more efficient page accesses.

In sum, in currently available PC systems, memory efficiency is at the mercy of the CPU and the operating system in light of the fixed addressing of conventional memory devices. Among other things, the fixed addressing scheme of presently available memory devices prevents accesses to non-contiguous memory spaces to be redirected to a contiguous memory space. In particular, no means are available for redirecting addresses such that data required for a given operation or task can be accessed from a single chip, let alone a single page in a single chip.

Thus, the need has arisen for memory devices with programmable decoders and systems and methods using the same. Such memories, systems and methods should allow memory accesses to be optimized and unused memory space minimized.

SUMMARY OF THE INVENTION

According to one embodiment of the principles of the present invention, a memory is provided comprising an array of memory cells, an address decoder for accessing a selected one of the cells in response to at least one address bit, and a programmable array for selectively presenting the at least one address bit to the address decoder in response to a control signal.

According to another embodiment of the principles of the present invention, a memory is provided including at least one memory bank including an array of rows and columns of memory cells, a row decoder for selecting a said row for access in response to at least one address bit and a column decoder for selecting a said column for access in response to at least one address bit. The memory also includes a programmable array for selectively presenting an address bit to at least one of the row and column decoders in response to at least one decode control signal.

The principles of the present invention are also embodied in address decoding circuitry which includes an address decoder and a programmable array for selectively presenting addresses to the address decoder under control of a decode control signal.

According to a further embodiment of the present invention, a memory system is provided which includes an address bus, control circuitry and a plurality of memory devices. Each memory device includes an array of memory cells, an address decoder for decoding addresses for selectively accessing the cells in the array, and a programmable array for selectively presenting addresses transmitted on the address bus to the decoder in response to a control signal received from the control circuitry.

The principles of the present invention are also provided in methods of operating memory systems. In one such embodiment, a method is provided for accessing data in a memory system including a plurality of memory devices, each having an array of memory cells, an address decoder for decoding addresses for selectively accessing the cells in the array and a programmable array for selectively presenting addresses to the decoder in response to a control signal. According to the method, an address is presented to the programmable array of each of the memory devices. The control signal is presented to the programmable array of a memory device to be accessed to enable presentation of the address to the decoder of such memory device to be accessed. A control signal is also presented to the programmable array of another memory device to disable the presentation of the address to the decoder of such other memory device.

The principles of the present invention provide substantial advantages over the prior art. Among other things, these principles allow accesses to non-contiguous memory spaces to be re-directed to a contiguous memory space. In particular, such principles allow for addresses to be re-directed such that data required for a given operation or task can be accessed from a small number of chips, even a single chip. Additionally, data may be packed into a single page in a single chip for additional efficiency.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts. While memory devices embodying the principles of the present invention are useful in a wide number of applications, for purposes of illustration, such memory devices will be described in conjunction with a basic processing system architecture typically employed in personal computers.

Figure 1:
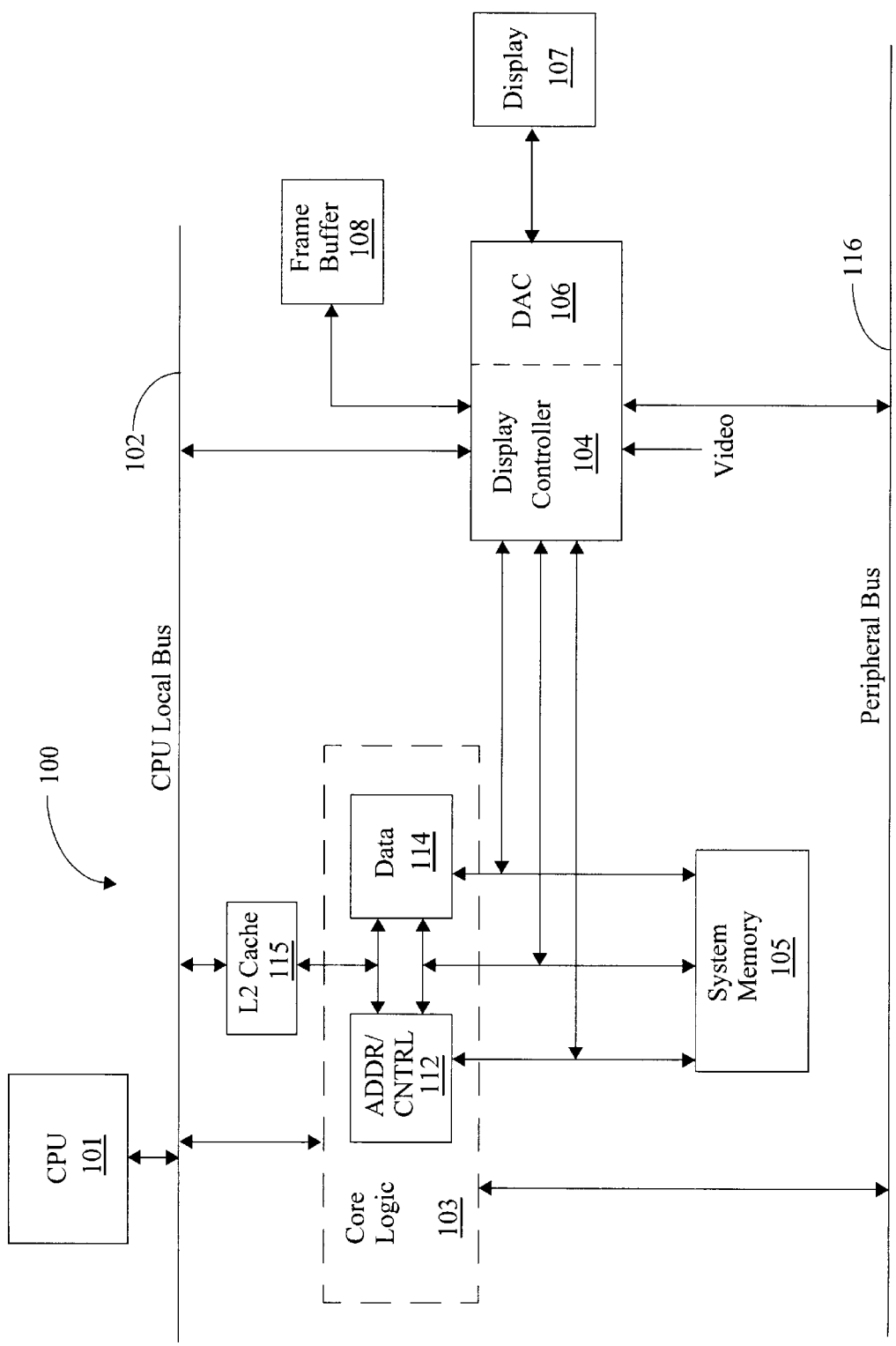
FIG. 1 is a high level functional block diagram of a information processing system architecture suitable for the application of the principles of the present invention.

FIG. 1 is a high level functional block diagram of the portion of a processing system 100. System 100 includes a central processing unit 101, a CPU local bus 102, core logic 103, a display controller 104, a system memory 105, a digital to analog converter (DAC) 106, frame buffer 108 and a display device 107.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be for example a general purpose microprocessor, such as an Intel Pentium™ class microprocessor or the like, used in commercial personal computers. CPU 101 communicates with the remainder of system 100 via CPU local bus 102, which may be for example a special bus, or a general bus (common in the industry).

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. One or more core logic chips, such as chip 112 in the illustrated system, are typically "address and system controller intensive" while one or more core logic chips, such as chip 114 in FIG. 1, are "data intensive." Address intensive core logic chip 112 generally: interfaces CPU 101 with the address path of CPU bus 102; maintains cache memory, including the cache tags, set associative cache tags and other data necessary to insure cache coherency; performs cache "bus snooping"; generates the control signals required for DRAMs in the system memory or cache; and controls general management transactions. Data intensive chip 114 generally: interfaces CPU 101 with the data path of CPU bus 102; issues cycle completion responses to address chip 112 or CPU 101; may abort operations if their cycles are incomplete; and arbitrates for the data path of bus 102.

CPU 101 can directly communicate with core logic 103 or through an external (L2) cache 115. L2 cache 115 may be for example a 256 KByte fast SRAM device(s). It should be noted that CPU 101 can also include on-board (L1) cache, typically up to 16 kilobytes.

Display controller 104 may be any one of a number of commercially available VGA display controllers. For example, display controller 104 may be one of the Cirrus Logic CL-GD754x series of display controllers. The structure and operation of such controllers is described in *CL-GD754x Application Book*, Rev 1.0, Nov. 22, 1994, and *CL-GD7542 LCD VGA Controller Preliminary Data Book*, Rev. 1.0.2, June 1994, both available from Cirrus Logic, Inc., Fremont, Calif., and incorporated herein by reference. Display controller 104 may receive data, instructions and/or addresses from CPU 101 either through core logic 103 or directly from CPU 101 through CPU local bus 102. Data, instructions, and addresses are exchanged between display controller 104 and system memory 105 through core logic 103. Further, addresses and instructions may be exchanged between core logic 103 and display controller 104 via a local bus which may be for example a PCI local bus. Generally, display controller 104 controls screen refresh, executes a limited number of graphics functions such as line draws, polygon fills, color space conversion, display data interpolation and zooming, and video streaming and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data to drive display 107 in response. In the illustrated embodiment, DAC 106 is integrated with display controller 104 onto a single chip. Depending on the specific implementation of system 100, DAC 106 may also include a color palette, YUV to RGB format conversion circuitry, and/or X- and Y-zooming circuitry, to name a few options. Display 107 may be for example a CRT unit, a liquid crystal display, electroluminescent display, plasma display, or other type of display device which displays images on a screen as a plurality of pixels. It should also be noted that in alternate embodiments, "display" 107 may be another type of output device such as a laser printer or similar document view/print appliance.

The data paths in system 100 will vary with each design. For example, system 100 may be a "64-bit" or "72-bit" system. Assume for discussion purposes that a 64-bit system is chosen. Then, each of the data connections, including the data paths of CPU bus 102 and PCI bus 116, the data paths through core logic 103 to system memory 109 and display controller 104, and the data interconnection between display controller 104 and frame buffer 108, are all 64 bits wide. It should be noted that the address interconnections will vary depending on the size of the memory and such factors as the need to support data byte select, error detection correction, and virtual memory operations. In a typical CPU processor system today, the address portions of CPU bus 102 and PCI bus 116 are typically on the order of 30 bits wide.

Figure 2:
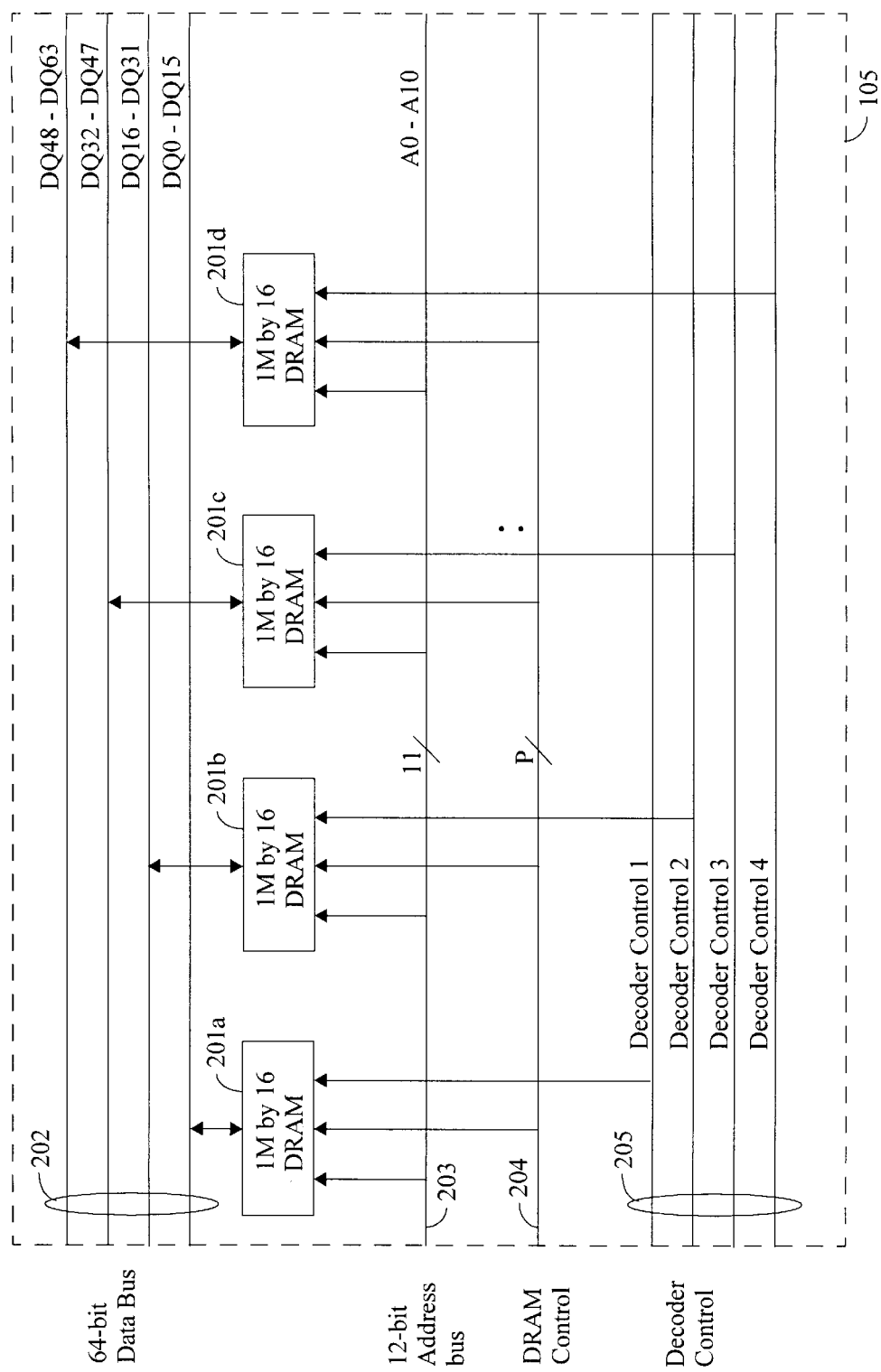
FIG. 2 is a more detailed functional block diagram of a memory subsystem, such as the system memory shown in FIG. 1, according to the principles of the present invention.

FIG. 2 is an exemplary architecture of system memory 105 according to the principles of the present invention. In the architecture of FIG. 2, one bank of four 1M bit by 16 DRAM devices 201a and 201d each embodying the principles of the present invention supports a 64-bit data bus 202. In the illustrated embodiment, data bus 202 allows the exchange of data with core logic 103. It should be noted that while only one bank of memory devices 201a–201d is shown in FIG. 2 for brevity and clarity, system memory 105 may comprise a multiple bank memory subsystem as is known in the art. Further, although 1M bit by 16 devices have been chosen for illustrative purposes, the principles of the present invention can also be embodied in varying size and word-width devices, for example, 512 Kbit by 32 or 2Mbit by 8 devices. The actual memory organization selected for a given application will depend on such factors as the width of the associated data bus, the capacity (size) required and/or the address space of the addressing device or system.

In the architecture of FIG. 2, each memory device 201a–201d supports a corresponding 16 lines of 64-bit wide bus 202. In the case of 1 Mword by 16 devices (i.e. having a capacity of 1 million words of 16 bits each), and assuming a 4096 row by 256 column by 16 bit/column organization, twelve (12) row address (including one or more bank select bits, as discussed further below) and 8 column address bits are required for full access, as received from core logic 103 via an address bus 203. Address bus 203 is preferably an 11-bit wide multiplexed address bus known in the art, although a non-multiplexed address bus, also as known in the art, may also be used. A p-bit wide bus 204 carries the typical DRAM control signals, such as /RAS, /CAS, /OE, /WE, CLK and CKE (clock enable), etc.

According to the principles of the present invention, each memory device 201a–201b additionally receives at least one DECODE CONTROL bit from core logic 103 via a bus 205. As will be discussed further below, these decode control bits allow for the selective programming of the row and/or column decoders of each memory 201, as required for a given access or sequence of accesses.

Figure 3:
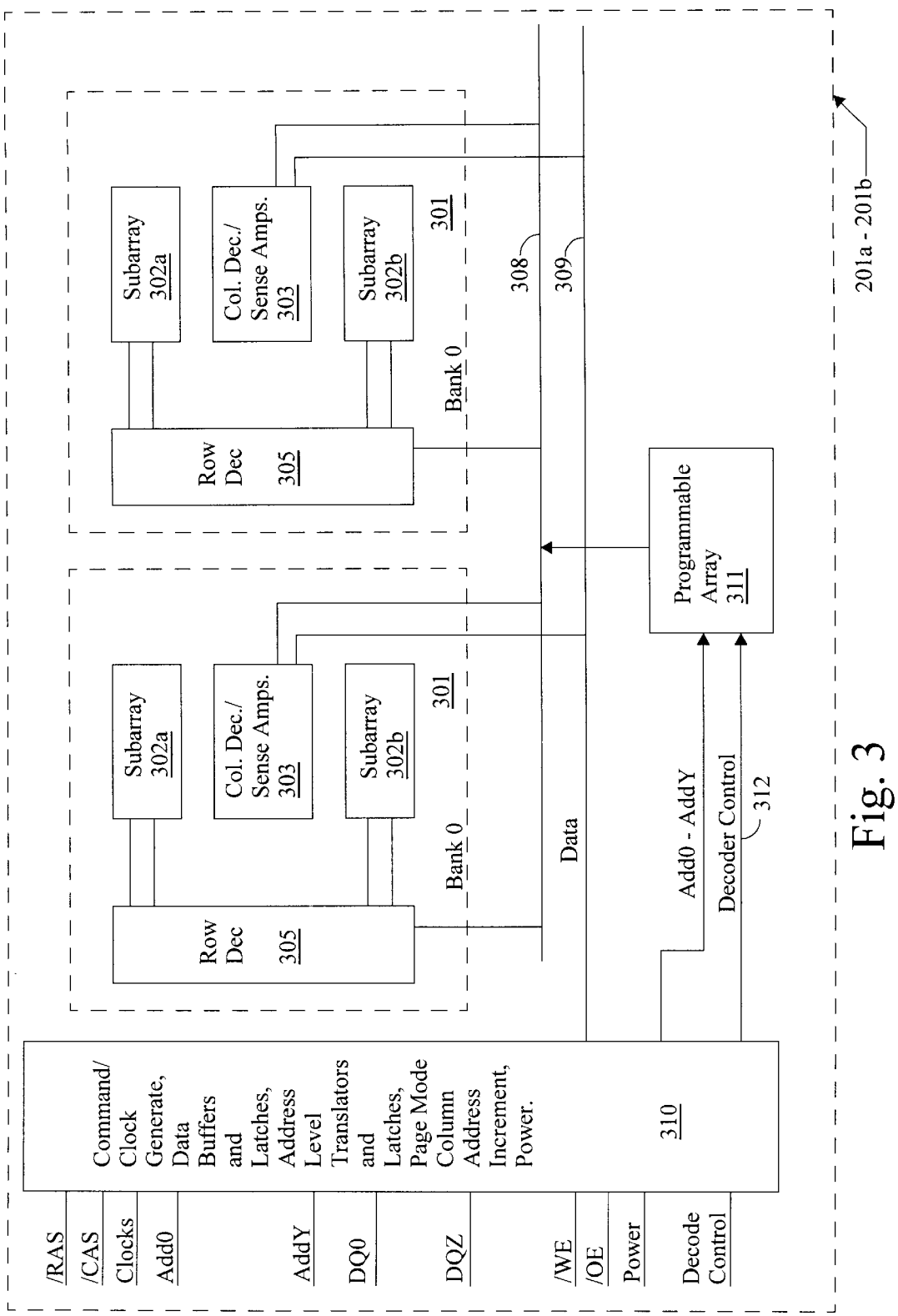
FIG. 3 is a more detailed functional block diagram of a memory, such as a selected one of the memories shown in the system of FIG. 2, according to the principles of the present invention.

FIG. 3 is a high level functional block diagram of a memory subsystem (device) 201a–201d embodying the principles of the present invention. Memory 201 may be used for example in the construction of system memory 105, as discussed above in conjunction with FIG. 2, or in any other memory application in which programmable address decoding may be advantageous. In the preferred embodiment, memory subsystems 201a–201b are fabricated as a single integrated device (chip), although the present inventive principals are not limited to such single chip embodiments.

In the preferred embodiment, memory subsystems 201a–201d include one or more internal memory banks 301. In FIG. 3, two such banks 301, labeled Banks 0–Bank 1, are shown for illustration purposes. Alternatively, memories 201a–201b may have only one bank 301 or may have more than two banks 301. Generally, in alternate embodiments, the exact number of banks will vary depending on such factors as available chip space, the address space of core logic 103 and the amount of data storage capacity required.

In memory subsystems 201a–201d, each memory bank 301 includes two subarrays 302a and 302b of dynamic random access memory (DRAM) cells, the entire array arranged as M number of rows and N number of columns. The subarrays 302a and 302b of each bank 301 are associated with column decoder-sense amplifier circuitry 303. In one embodiment of memory subsystems 201a–201d, the subarrays 302a and 302b of each bank 301 are coupled to the corresponding sense amplifiers in an open-bitline arrangement. For example, each subarray 302a may contain the "true" half-bitlines $BL_M$ and subarray 302b correspondingly would contain the complementary half-bitlines /BLm for the corresponding bank 301. In a second embodiment, the bitlines of each subarray 302 may be organized in a folded bitline arrangement, with a given bitline BLm and its complement /BLm disposed in the same subarray 302.

The wordlines associated with the rows of cells in each subarray 302 are coupled to and controlled by row decoder circuitry 305. An exemplary address decoder circuit, suitable for use in either column decoder-sense amplifier circuitry 303 or row decoders 305 is discussed further in conjunction with FIG. 4.

Column addresses are presented to the column decoders of circuit blocks 303 and row addresses to the blocks of row decoder circuitry 305 via an internal address bus 308. Column and row addresses may be transmitted on bus 308 on dedicated (non-multiplexed) row and column address lines or on a single set of lines in a multiplexed fashion. Data is exchanged with an addressed location within the subarrays 302 of a selected bank 301 via a data bus 309 and the corresponding column decoder of circuitry 303.

Data, address, clocks, and control signals are exchanged with memory subsystems 201a–201b through input/output and control circuitry 310. In system 100, these signals may be received from core logic 103 via data bus 202, address bus 203 and DRAM control bus 204 (FIG. 2). Circuitry 310 includes conventional clock generation circuitry for generating the clocks needed to drive the dynamic circuitry of memory 200. Input/output circuitry 310 further includes conventional data buffers and latches, address level translators and address latches, page mode column incrementation circuitry and circuitry for controlling power distribution. Among the received clocks may be a master clock, if memories 201a–201d are a synchronous DRAMs.

Preferably, memory subsystems 201a–201d are designed for operation with a multiplexed address bus 203. In the illustrated embodiment, subsystems 201a–201d includes a Y-bit wide address port (lines ADD0–ADDY) and a Z-bit wide data port (DQ0–DQZ). In the illustrated organization, discussed above, the address port is 11-bits wide (i.e. Y=11) and the data port is 16 bits wide (i.e. Z=16). Data reads and writes controlled by conventional write enable signal (WE) and a conventional output enable signal (/OE) from control bus 204.

According to the principles of the present invention, chip enable (select) for a given access is effectuated using the decode control signals DECODE CONTROL. Among other things, this provides a substantial advantage over prior art memory architectures which use multiple /RAS and/or /CAS signals in various, and often complex, combinations.

Some of the fundamental principles of DRAM construction and operation are described in: "*A 5-volt Only 64k DRAM*", L. S. White, N. H. Hong, D. J. Redwine, and G. R. Mohan Rao, International Solid State Circuit Conference 1980, Digest of Technical Papers, pp. 230–231; "A 64-k Dynamic RAM Needs Only One 5-volt Supply to Outstrip 16k Parts", G. R. Mohan Rao and John Hewkin, Electronics, Sep. 28, 1978, pp. 109–116; "*A 1 Mb DRAM With Design-For-Test Functions*," J. Neal, B. Holland, S. Inoue, W. K. Loh, H. McAdams and K. Poteet, International Solid State Circuit Conference 1986, Digest of Technical Papers, pp. 264–265; "*A 4 Mb DRAM With Half Internal-Voltage Bitline Precharge*", International Solid State Circuit Conference 1986, Digest of Technical Papers, pp. 270–271; "*A Full Bit Prefetch Architecture For Synchronous DRAMs*", T. Sunaga, K. Hosokawa, Y. Nakamura, M. Ichinose, A Moriwaki, S. Kakimi and N. Kato, IEEE Journal of Solid State Circuits, Vol 30., No. 9, September 1995, pp. 994–1005; and "*DRAM Macros For ASIC Chips*", IEEE Journal of Solid State Circuits, Vol 30., No. 9, September 1995, pp. 1006–1014, each incorporated herein by reference.

Figure 4:
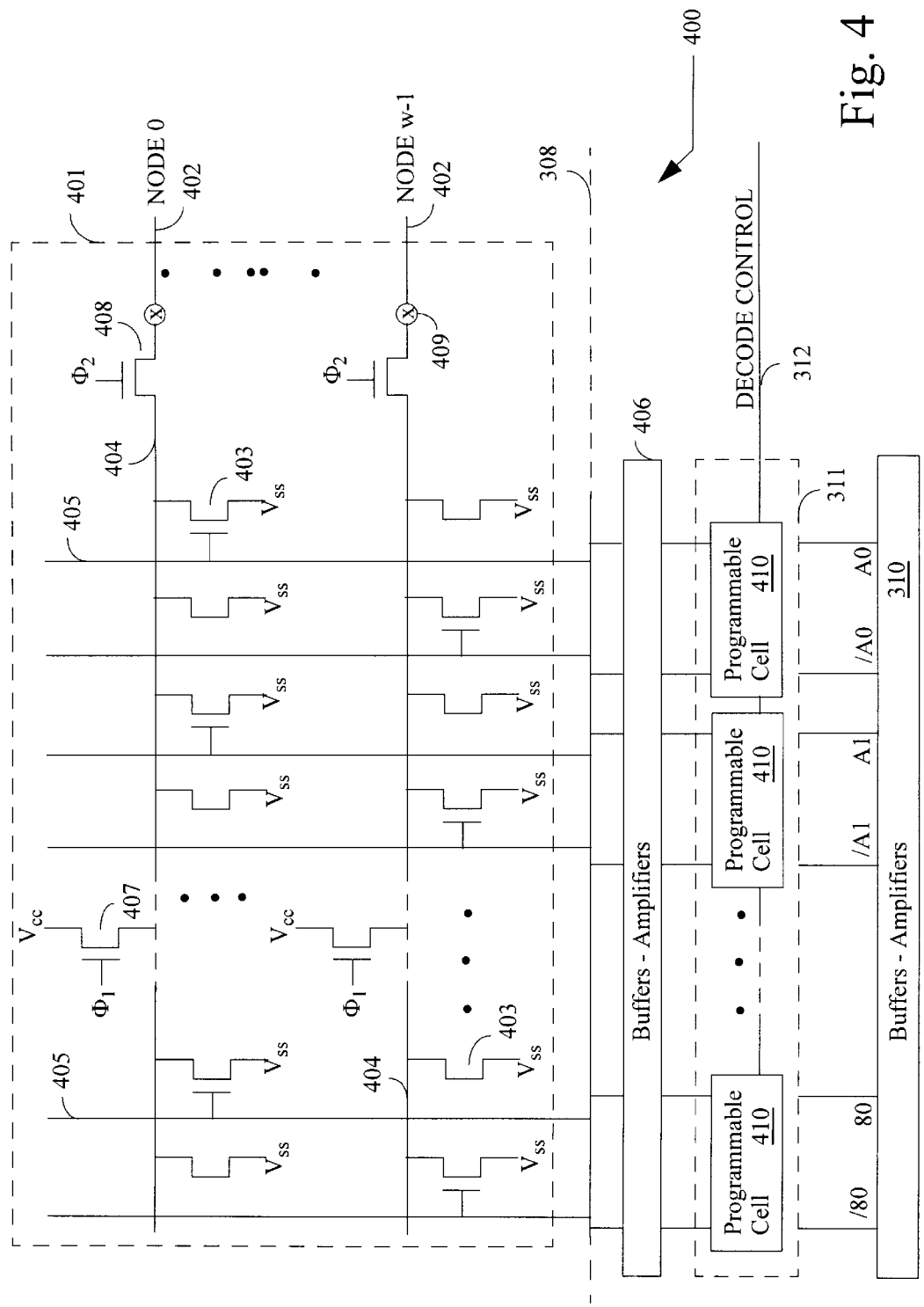
FIG. 4 is a more detailed functional block diagram depicting the interface between the programmable array and a selected one of the decoders shown in FIG. 3.

FIG. 4 is a electrical schematic diagram of a representative portion of preferred decoder logic 400 suitable for use in row decoder circuitry 305 and/or column decoder circuitry 303. Each block of decoder logic 400 includes a conventional "hardwired" decoder 401, which comprises an array of individual decoders 402 controlling the voltages at a corresponding set of control nodes, labeled NODE 0–NODE W-1 for discussion.

In the case of row decoder logic 305, control nodes NODE 0–NODE W-1 are each coupled to a corresponding one of the M number of wordlines associated with the M number of rows in a given bank 301. Preferably, for a given bank 301, Nodes 0 to W/2-1 control wordlines 0 to M/2-1, disposed in subarray 302a and Nodes W/2 to W-1 control wordlines M/2 to M-1, disposed in subarray 302b.

In the case of column decoder logic 303, control nodes NODE 0 to NODE W-1 are coupled the amplifiers/buffers of the column decoder global input/output circuitry of sense amplifier-column decoder circuitry 303 of the given bank 301 and control the selection of one of N number of columns in the corresponding array 302 per column address.

Each decoder 402 of decoder array 401 in the illustrated embodiment is a NOR decoder comprising a linear array of transistors 403 and a conductive line 404. The source of each transistor 403 is preferably directly connected to the corresponding line 404. The number of transistors 403 required in each decoder is a function of the number of address bits, including bank select bits, and their complements, being decoded.

For discussion purposes, assume that in the two bank organization of memories 201a–201d that each bank 301 is in a separate address space differentiated by one or more of the higher order address bits of each row address. Also, assume that each of the arrays of banks 301a and 301b are each 8 megabit arrays organized as 2048 rows by 256 columns of 16 bits each, with 1024 rows disposed in each subarray 302.

For a multiplexed addressing scheme therefore, each row address includes 11 bits A0–A10 and one bank select bit B0. Their complements /A0–/A10 and /B0 are generated internal to memories 201a–201d as required to implement the NOR logic of decoders 402. Hence, for row decoder circuitry 305, each decoder 402 includes 24 transistors 403.

Each column address includes 8 column address bits A0–A7, with the complements /A0–/A7 generated internally. In column decoder circuitry 303, each decoder 402 therefore includes 16 transistors 403.

Address and/or bank select bits are presented to the gates of selected transistors 403 via address lines 405 from amplifiers/buffers 406. The gates of other selected transistors 403 are "no connects" as required to allow each decoder 402 to respond to a unique address while maintaining an appropriate capacitive loading on the corresponding lines 404.

Each decoder 402 includes a pair of transistors 407 and 408 which control the precharging of an associated control line 404. During precharge, transistors 407 are turned-on by clock $\phi_1$ and transistors 408 are turned-off by clock $\phi_2$. Control lines 404 are then pulled to Vcc through transistors 407. Next, control lines 404 are selectively pulled down, or allowed to remain charged in the case of the selected row or column, by transistors 403 in response to the addresses presented on address lines 405 from the corresponding address buffer-amplifiers 406. Transistors 408 are then turned on to couple each line 404 to the associated NODE.

Each primary decoder 402 is coupled to the corresponding wordline or global I/O circuitry through a link 409. Links 409 allow selected decoders 402 to be disconnected from the associated row or column of cells, if such row or column is defective, thereby making that row or column unaddressable. The defective column or row can then be replaced with a redundant column or row (not shown).

According to the principles of the present invention, address bits are presented to the address lines 405 of hardwired decoder 401 through buffers-amplifiers 406 and programmable array 311 (FIG. 3). In particular, each pair of complementary addresses A0x,/A0x are passed from the address-buffer amplifiers within I/O circuitry 310 to the corresponding address lines through a corresponding programmable cell 410. In the preferred embodiment, row address bits are pipelined through programmable array 311 to the row decoders 305 followed by the pipelining to the column decoders of the column address bits, as received from a multiplexed address bus 203. Each of the programmable cells 410 of array 311 are controlled by the DECODE CONTROL bit received by the given memory device 201 from core logic 103.

Figure 5:
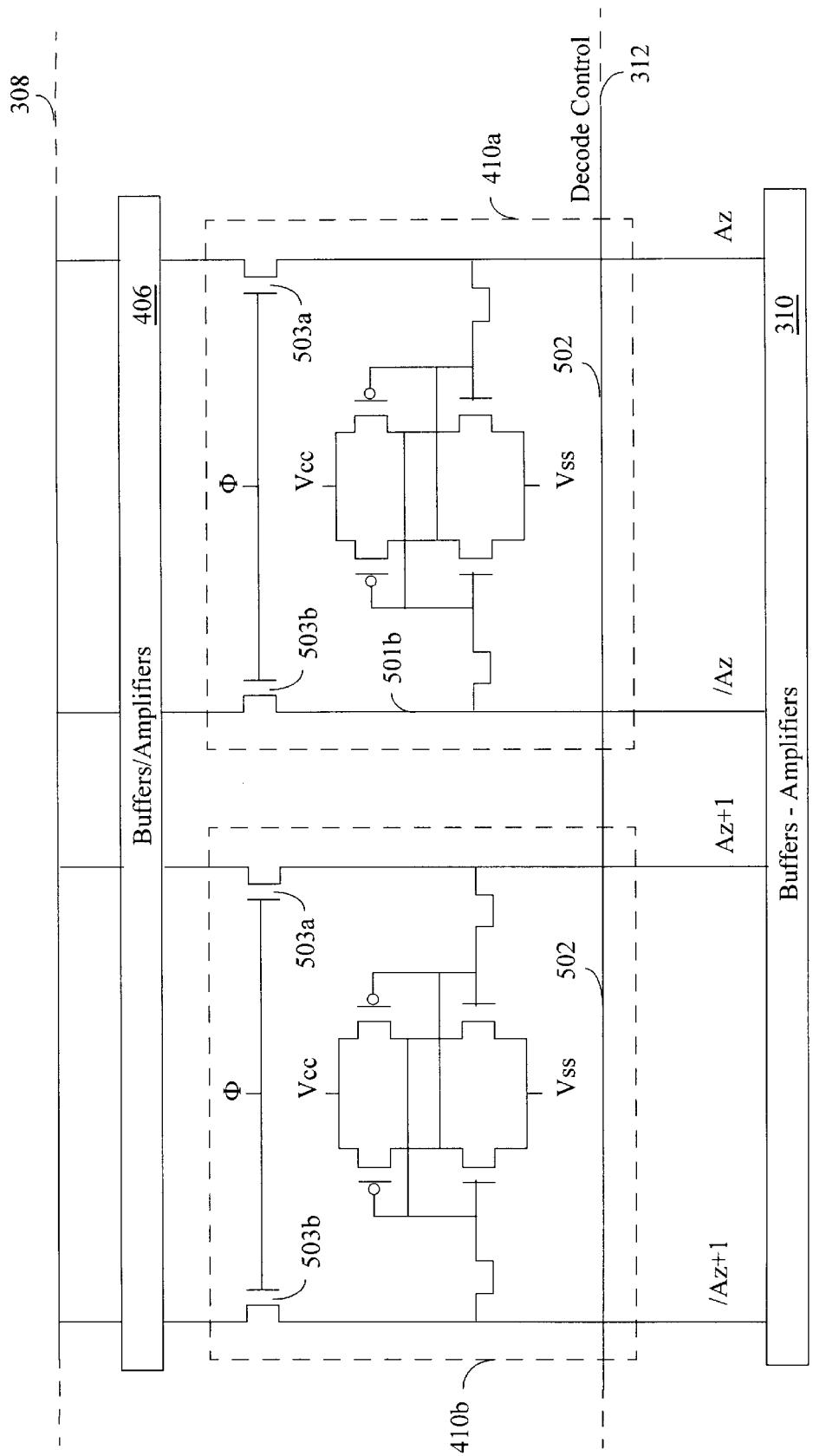
FIG. 5 is an electrical schematic diagram depicting exemplary programmable cells suitable for use in a preferred embodiment of the programmable cell array shown in FIGS. 3 and 4.

FIG. 5 is a more detailed electrical schematic diagram depicting a randomly selected pair of adjacent programmable cells 410a and 410b. Each cell 410 is a volatile (programmable) memory cell, such as an SRAM or DRAM cell. In the preferred embodiment shown in FIG. 5, each programmable memory cell 410 comprises a 6-transistor (6t) static random access memory cell. The SRAM cell bitlines 501 for each cell 410 are coupled to an associated pair of complementary address lines, labelled Az+1 and /Az+1 in the case of cell 410b and Az and /Az in the case of cell 410a. Addresses received from address buffers-amplifiers can be selectively latched into the programmable cells 410 in response to the presentation of the active (high) logic state of the decode control signal to the SRAM wordline 502 of each cell in the linear array. Addresses are pipelined on to buffer-amplifiers 406 and decoder array 401 through a pair of clocked transistors 503a and 503b.

The operation of the exemplary system memory 105 comprised of memories 201a–201d according to the principles of the present invention can now be discussed in detail. Advantageously, several different types of memory operations can be performed which normally cannot be performed in currently available memory systems, primarily as a result of the fixed nature of existing address decoding schemes.

In a first illustrative operation in the exemplary system of FIG. 2, an instruction from CPU 101 and the operating system application software calls for a data access (read or write) to a given location in memory device 201d. For discussion purposes assume that the location is at Address 0, for both the row and column address bits. Also assume that for memory use efficiency, it would be preferable to access the same data with memory 201a instead.

In this case, the memory controller within core logic 103 moves the access from memory device 201d to memory device 201a using the programmable arrays 311. Specifically, the memory controller sets decoder control signal DECODE CONTROL 1 to a logic high and decoder control signals DECODE CONTROL 2,3, and 4 to a logic low. This prevents the decoding of Address 0 by memory devices 201b–201d and instead, Address 0 is latched into the SRAM cells 410 of memory 201a and correspondingly pipelined to and decoded by the memory 201a fixed decoder 401. In sum, the access has been moved by redirecting or "moving" the address from device 201d to 201a. Additional address moves between the various memories 201 of system 105 can similarly be made.

It should be noted that when moving a word of data by moving the address, the memory controller (core logic 103) tracks that data by tracking the decode control bits associated with that data, as well as the address. The memory controller also tracks the change in data lines necessary to implement the access after the move. In the present example, the original access of memory 201d would have resulted in a data transfer across data lines DQ48–DQ63. After the address move, the access of memory 201a results in a data transfer across lines DQ0–DQ15.

Multiple access moves using address moving, as discussed above, can advantageously direct a series of data accesses to a single chip. Thus, for example, all accesses of data of a certain type or of all data required for execution of a given set of instructions could be directed to a single chip. Among other things, the amount of wasted memory space and/or the number of chips required for an application could be reduced if the memory space of each chip is substantially used before another chip is called upon. Additionally, if a series of accesses are directed to a single chip, the other chips in the memory subsystem could either be placed in stand-by to reduce power or placed in precharge to prepare for upcoming accesses. In this case, the decoder control bits could be used to control the active, standby and precharge modes of the non-accessed devices. Further, data of a given type could be associated with a single decode signal, thereby making access to that data an associative function of the address and the corresponding decode signal.

Besides providing for the moving of data between memory devices 201a–201d, the principles of the present invention further allow for data to be packed into a contiguous block within a single memory device. For example, besides redirecting the address to a given memory 201a–201d using the programmable arrays 311, the memory controller may also change one or more of the address bits (again either row or column address bits) before storing the address in the programmable array 311 of the destination memory 201a–201d. In this manner, the memory controller may direct data to a contiguous space of rows and columns in a given memory device.

Within a memory device 201a–201d, data may be redirected to a contiguous row or rows of cells such that more efficient page mode accesses can be performed. A page access according to the principles of the present invention may be effectuated as follows. Assume that two writes of related data are directed by CPU 101 and the operating system to memory 201d at row 0, column 0 and memory 201c at row 4, column 4, respectively. Assume also that for efficiency the two words are to be moved to row 0 of memory 201a, starting with page (column) 0. It should be noted that while two page writes are being illustrated, varying number of page accesses (reads or writes) may be performed, depending on the data requirements of the CPU and operating system, and the pages available along the selected row.

The addresses to memories 201c and 201d are moved to memory 201a by setting DECODE CONTROL bit 1 high and DECODE CODE control bits 2–4 low. For the first word, the row address remains the same and is presented on address bus 202 and pipelined through the memory 201a programmable array 311 to the selected row decoder 305 (depending on the bank select bit). The column address for word 1 is then modified by the memory controller to write the word to page 0. The new column address is then pipelined through the memory 201a programmable array 311 to the column decoders of the selected bank. Next, the column address for word 2 is modified to write word 2 into page 2 of row 0 of device 201a and then pipelined through the programmable array 311 of memory 201a. The row address for word 2 at row 4 in memory 201c can simply be discarded. On a subsequent read, the words 1 and 2 can be paged out during a page access of Row 0, memory device 201a.

The principles of the present invention, in the exemplary system of FIG. 2, additionally will allow multiple 16-bit words of data (i.e. multiple locations) to be accessed by a single address. In this case, a desired address (row and column bits) is generated and the decoder control bits and programmable arrays 311 used to selectively presented that address to the memory 201a–201d to which the selected word of data is to be accessed. Similarly, multiple addresses can be associated with a single word or storage location. In this case, the decoder control bits and programmable arrays 311 are used to direct the addresses to the appropriate memory 201a–201d. The memory controller may then modify one or more address bits as required to locate the access within the selected memory. Within a given multiple bank memory, such as memory 201, data can also be selectively moved into a single bank 301a or 301b. In this case, the memory controller modifies the one or more bank select bits (preferably forming part of each row address, as discussed above) prior to pipelining through the corresponding programmable array 311. This provides the additional advantage of allowing similar data or data used in a sequence of operations to not only be stored within a single device, but also within a single bank within that device. Thus, while accesses are being made to one bank 301a/301b, the other bank may be placed in standby to save power, precharged in anticipation of upcoming accesses or refreshed, to name a few options.

It should be noted that in the memory subsystem of FIG. 2, 32-bit and 64-bit accesses can still be performed using conventional addressing techniques. In this case, multiple DECODE CONTROL bits are set active to pass the address bits through to the address decoders for decoding in the typical fashion.

Although the present invention and its advantages have been described in detail, it should be understood that various changes, substitutions and alterations can be made herein without departing from the spirit and scope of the invention as defined by the appended claims.

What is claimed is:

1. A memory having address redirection circuitry comprising:
   an array of memory cells;
   a hardwired address decoder for accessing a selected one of said cells in response to at least one address bit; and
   a programmable volatile storage array for selectively redirecting said at least one address bit presented on an external bus to said address decoder in response to a control signal.

2. The memory of claim 1 wherein said address decoder comprises a hardwired decoder.

3. The memory of claim 2 wherein said address decoder comprises dynamic decoder circuitry.

4. The memory of claim 1 wherein said programmable volatile storage array of memory cells comprises an array of static random access memory cells.

5. The memory of claim 1 wherein said address decoder comprises a row decoder.

6. The memory of claim 1 wherein said address decoder comprises a column decoder.

7. A memory comprising:
   at least one memory bank including an array of rows and columns of memory cells, a hardwired row decoder for selecting row of said array for access in response to at least one address bit and a hardwired column decoder for selecting a column of said array for access in response to at least one address bit; and
   a programmable volatile memory cell array for selectively redirecting an address bit presented on an external address bus to at least one of said row and column decoders in response to at least one decode control signal.

8. The memory of claim 7 wherein said row decoder comprises:
   an array of transistors for selectively controlling voltages on a set of control lines, each said control line controlling a wordline associated with a row in said array; and
   a plurality of address lines each coupled to selected ones of said transistors and said programmable array.

9. The memory of claim 8 wherein said programmable array comprises an array of memory cells, an address line coupled to a corresponding one of said memory cells.

10. The memory of claim 7 wherein said column decoder comprises:
    an array of transistors for selectively controlling voltages on a set of control lines, each said control line controlling selection of a column of cells;
    a plurality of address lines each coupled to selected ones of said transistors and said programmable array.

11. The memory of claim 10 wherein said programmable array comprises an array of memory cells, an address line coupled to a corresponding one of said memory cells.

12. The memory of claim 10 wherein said volatile memory cells comprise static random access memory cells.

13. Address decoding circuitry comprising:
    a hardwired address decoder; and
    a programmable memory cell array for selectively redirecting addresses presented on an external address bus to said address decoder under control of a decode control signal.

14. The address decoding circuitry of claim 13 wherein said decoder comprises:
    at least one control line;
    a plurality of transistors for controlling a voltage on said at least one control line; and
    a plurality of address lines coupling selected ones of said transistors with said programmable array.

15. The address decoding circuitry of claim 14 wherein said programmable memory cell array comprises a plurality of memory cells, each said memory cell coupled to a corresponding one of said address lines.

16. The address decoding circuitry of claim 14 wherein said programmable array comprises static random access memory cell, a first bitline of said memory cell coupled to a corresponding said address line and a second bitline of said memory cell coupled to a address line complementary to said address line coupled to said first bitline of said cell.

17. The address decoding circuitry of claim 16 wherein said decode control signal is presented to a wordline of said static random access memory cells.

18. A memory system comprising:

an address bus;

control circuitry; and a plurality of memory devices each comprising:
- an array of memory cells;
- a hardwired address decoder for decoding addresses for selectively accessing said cells in said array;
- a programmable array for selectively redirecting addresses transmitted on said bus to said decoder of said memory device in response to a control signal received from said control circuitry.

19. The memory system of claim 18 wherein first and second ones of said plurality of memory devices are each associated with a selected address space.

20. The memory system of claim 18 wherein said control circuitry is operable to move an address to a first selected one of said memory devices to a second selected one of said memory devices by selective presentation of control signals to said programmable arrays of said first and second memory devices.

21. The memory system of claim 18 wherein each said programmable array is controlled by an independent said control signal.

22. The memory system of claim 20 wherein said control circuitry is further operable to modify said address to said first selected one of said memory devices prior to moving said address to said second memory device.

23. The memory system of claim 18 wherein said control circuitry comprises a memory controller.

24. The memory system of claim 18 wherein said control circuitry comprises core logic.

25. A method of accessing data in a memory system including a plurality of memory devices each having an array of memory cells, a hardwired address decoder for decoding addresses for selectively accessing the cells in the array and a programmable array for selectively directing addresses to the decoder in response to a control signal, the method comprising the steps of:
- presenting an address to the programmable array of each of the memory devices;
- presenting a control signal to the programmable array of a memory device to be accessed to direct the address to the decoder of the memory device to be accessed; and
- presenting a control signal to the programmable array of another memory device to disable the presentation of the address to the decoder of the another memory device.

26. The method of claim 25 wherein the address decoders comprise row decoders and said step of presenting an address comprises the step of presenting a row address.

27. The method of claim 25 wherein the address decoders comprise column decoders and said step of presenting an address comprises the step of presenting a column address.

28. The method of claim 25 and further comprising the step of modifying at least one bit forming the address prior to said step of presenting the address to the programmable array of each of the memory devices.

* * * * *